United States Patent
Danny Chang

(10) Patent No.: US 10,338,097 B2
(45) Date of Patent: Jul. 2, 2019

(54) JOGGLE JOINTED DETECTION APPARATUS

(71) Applicant: STROMLINET NANO LIMITED, Central (HK)

(72) Inventor: Chia-Wei Danny Chang, Central (HK)

(73) Assignee: STROMLINET NANO LIMITED, Central (HK)

( * ) Notice: Subject to any disclaimer, the term of this patent is extended or adjusted under 35 U.S.C. 154(b) by 144 days.

(21) Appl. No.: 15/532,502

(22) PCT Filed: Dec. 29, 2015

(86) PCT No.: PCT/CN2015/099360
§ 371 (c)(1),
(2) Date: Jun. 16, 2017

(87) PCT Pub. No.: WO2016/110198
PCT Pub. Date: Jul. 14, 2016

(65) Prior Publication Data
US 2017/0370963 A1 Dec. 28, 2017

Related U.S. Application Data

(60) Provisional application No. 62/100,850, filed on Jan. 7, 2015.

(51) Int. Cl.
*G01Q 60/38* (2010.01)
*G01Q 10/04* (2010.01)
(Continued)

(52) U.S. Cl.
CPC ............. *G01Q 60/38* (2013.01); *G01Q 10/04* (2013.01); *H01L 41/053* (2013.01); *H02N 2/043* (2013.01); *H01L 41/0973* (2013.01)

(58) Field of Classification Search
CPC ...... G01Q 60/38; G01Q 10/04; H01L 41/053; H02N 2/043
See application file for complete search history.

(56) References Cited

U.S. PATENT DOCUMENTS 6,335,864 B1 * 1/2002 Klubenspies ............. G09F 9/35
349/58
9,069,007 B2 6/2015 Proksch
(Continued)

FOREIGN PATENT DOCUMENTS

CN 1150253 A 5/1997
CN 1287130 A 3/2001
(Continued)

OTHER PUBLICATIONS https://www.instructables.com/id/A-Low-Cost-Atomic-Force-Microscope-%E4%BD%8E%E6%88%90%E6%9C%AC%E5%8E%9F%E5%AD%90%E5%8A%9B%E9%A1%AF%E5%BE%AE%E9%8F%A1/ Apr. 27, 2014; Step 1, 11, and Figs.
(Continued)

*Primary Examiner* — David Z Huang
(74) *Attorney, Agent, or Firm* — Chun-Ming Shih; HDLS IPR Services

(57) ABSTRACT

A detection apparatus used for detecting an object includes a first platform, a second platform and a plurality of screws. The first platform includes a plurality of first circuit boards that are joggle jointed and combined with each other, at least part of the first circuit boards are electrically connected to each other, and a carrying table for carrying the object to be detected is disposed on the first platform. The second platform includes at least one second circuit board, a detection module being disposed on the second platform for detecting the object, and the detection module is electrically connected to at least a part of the second circuit board. The screws are connected between the first platform and the (Continued)

second platform. The detection apparatus is mainly made by joggle jointing the circuit boards, so that the manufacturing is easy, costs are low, and the detection apparatus is easy to assemble, has small volume and light weight, and is convenient to carry.

13 Claims, 4 Drawing Sheets

(51) Int. Cl.
      *H01L 41/053*     (2006.01)
      *H02N 2/04*     (2006.01)
      *H01L 41/09*     (2006.01)

(56) References Cited

U.S. PATENT DOCUMENTS

| | | | |
|---|---|---|---|
| 2014/0354316 A1* | 12/2014 | Matsuoka | G01R 31/2887 324/750.24 |
| 2017/0074940 A1* | 3/2017 | Li | G09G 3/006 |

FOREIGN PATENT DOCUMENTS

| | | |
|---|---|---|
| CN | 201590798 U | 9/2010 |
| CN | 103808967 A | 5/2014 |
| CN | 103941044 A | 7/2014 |

OTHER PUBLICATIONS

Office Action dated Nov. 22, 2018 of the corresponding China patent application.

* cited by examiner

JOGGLE JOINTED DETECTION APPARATUS

BACKGROUND OF THE INVENTION

Field of the Invention

The present invention generally relates to a detection apparatus and, more particular to, a detection apparatus manufactured easily.

Description of Prior Art

An atomic force microscope is a detection apparatus used for detecting tiny objects. An atomic force microscope can accurately measure shapes of tiny objects by means of a probe contacting with surfaces of the objects and moving along surfaces of the objects, and then motions of the probe can be read by an optical lever. Nowadays the atomic force microscopes are all made of metal. Nevertheless, metals are not only expensive but also hard to be manufactured, and it is inconvenient for carry.

In view of the above drawbacks, the Inventor proposes the present invention based on his expert knowledge and elaborate researches in order to solve the problems of prior art.

SUMMARY OF THE INVENTION

Accordingly, an object of the present invention is to provide a detection apparatus for facilitating manufacturing.

The present invention provides a detection apparatus used for detecting an object comprises a first platform, a second platform and a plurality of screws. The first platform comprises a plurality of first circuit boards that are joggle jointed and combined with each other, at least part of the first circuit boards are electrically connected to each other, and a carrying table for carrying the object to be detected is disposed on the first platform. The second platform comprises at least one second circuit board, a detection module for detecting the object is disposed on the second platform, and the detection module is electrically connected to at least a part of the second circuit board. The screws are connected between the first platform and the second platform.

Preferably, the detection apparatus further include an actuator mechanism disposed on the first platform. The actuator mechanism is connected and moved together with the carrying table. The actuator mechanism includes a plurality of piezoelectric buzzers disposed on the first platform and a plurality of supporting poles connected between the piezoelectric buzzers and the actuator mechanism correspondingly.

Preferably, the detection apparatus further include an actuator mechanism disposed on the second platform. The actuator mechanism is connected and moved together with the detection module. The actuator mechanism includes a plurality of piezoelectric buzzers disposed on the second platform and a plurality of supporting poles connected between the piezoelectric buzzers and the actuator mechanism correspondingly.

Preferably, each of the screws is electrically connected with one of the first circuit board and one of the second circuit board.

Preferably, the detection module includes a probe, and the detection module includes an optical sensing element.

Preferably, the second circuit board is provided with a plurality of nuts corresponding to the screws. Each of the nuts is electrically connected with the second circuit board, and each of the screws is screwed with the nut correspondingly and abutted against the first platform. One of the first circuit board is provided with a hole-electrode, a slot-electrode and a sheet-electrode, wherein one of the screws is abutted against the hole-electrode, another screw is abutted against the slot-electrode, and still another screw is abutted against the sheet-electrode. The screws are electrically connected with the hole-electrode, the slot-electrode and the sheet-electrode separately for the first platform electrically connecting with the second platform.

Comparing to the prior art, the detection apparatus of the present invention are configured of circuit boards that are joggle jointed and combined with each other. Therefore, the detection apparatus is easy to assemble, has small volume and light weight, and is convenient to carry.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
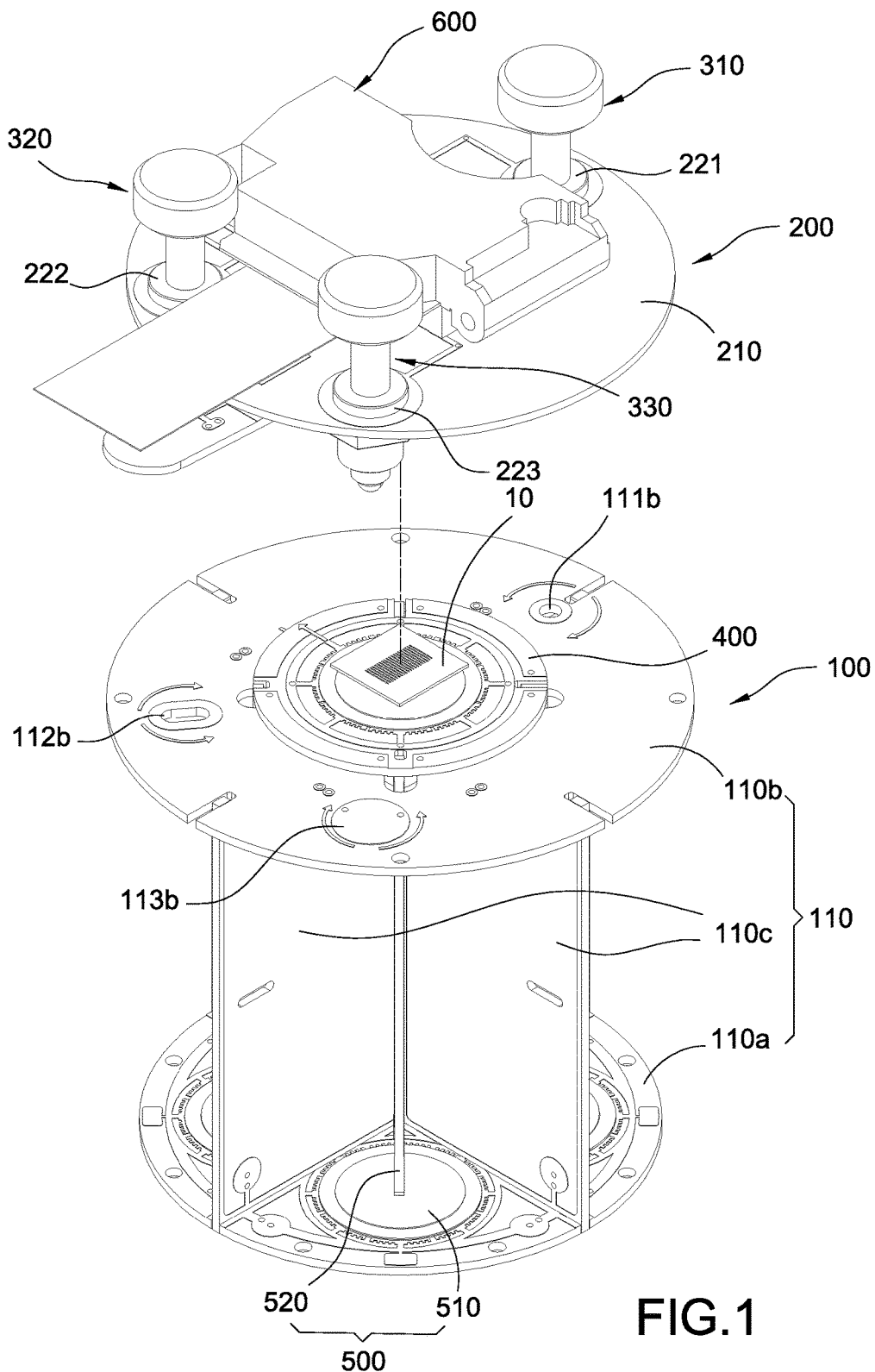
FIG. 1 is a perspective explosion schematic view of a preferred embodiment of a detection apparatus of the present invention.
Figure 2:
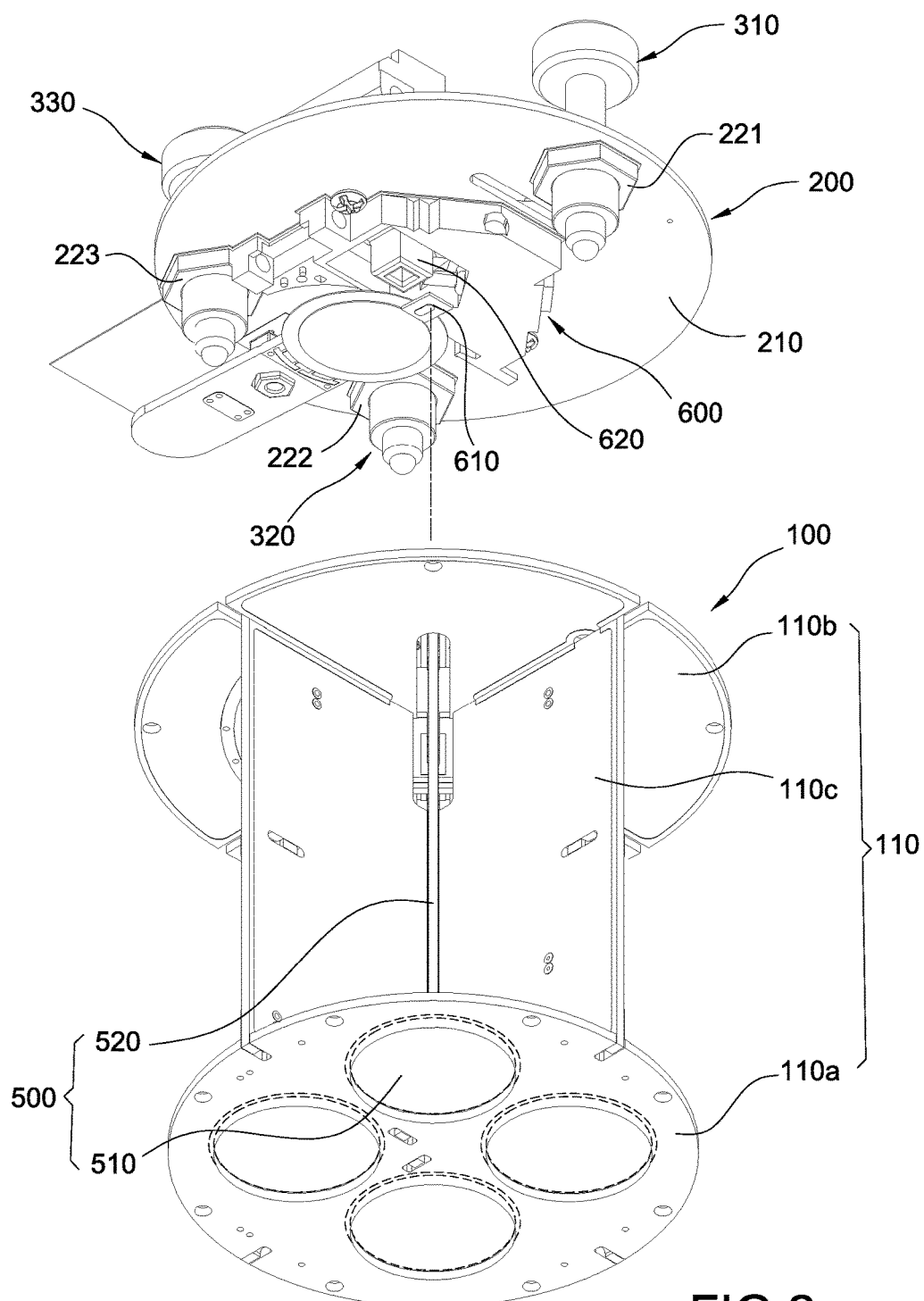
FIG. 2 is another perspective explosion schematic view of a preferred embodiment of a detection apparatus of the present invention.
Figure 3:
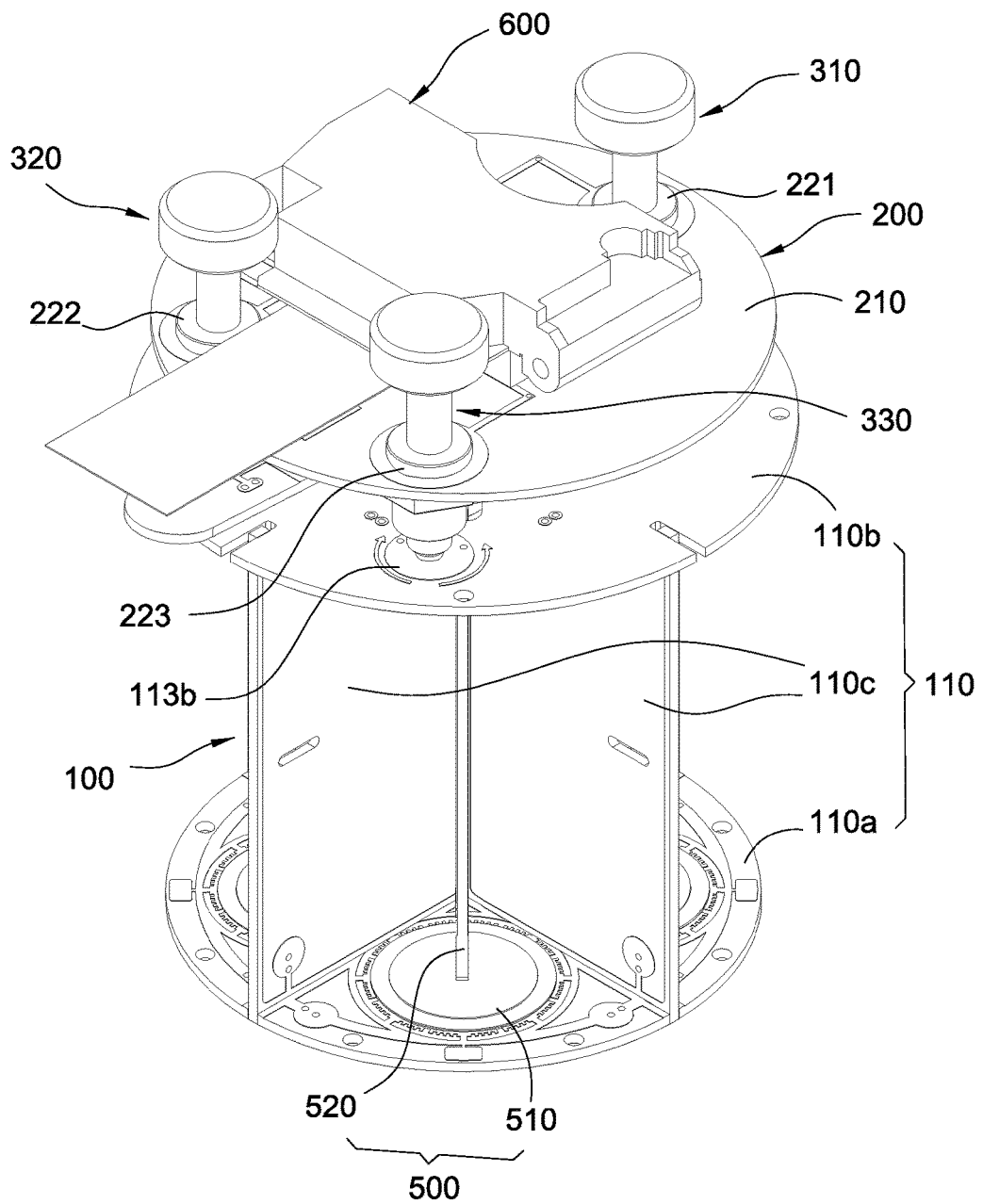
FIG. 3 is a perspective schematic view of a preferred embodiment of a detection apparatus of the present invention.

Please refer to FIG. 1 to FIG. 3. A preferred embodiment of the present invention provides a detection apparatus for detecting an object 10. The detection apparatus of the present invention includes a first platform 100, a second platform 200, a plurality of screws 310, 320, 330, a carrying table 400, an actuator mechanism 500 and a detection module 600.

Figure 4:
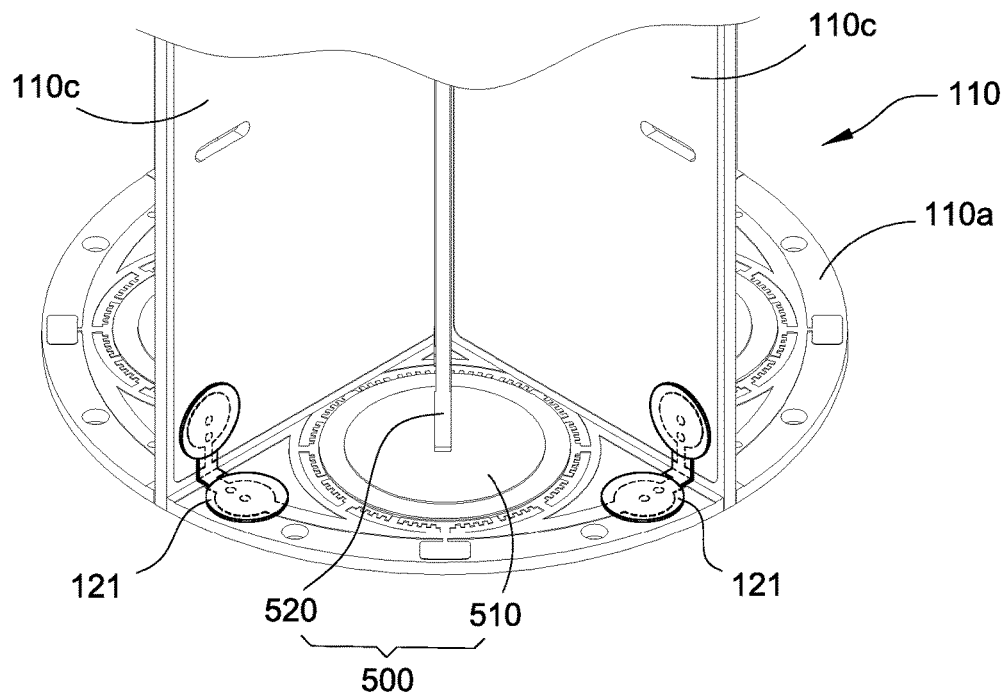
FIG. 4 is another perspective schematic view of a preferred embodiment of a first platform of a detection apparatus of the present invention.
Figure 5:
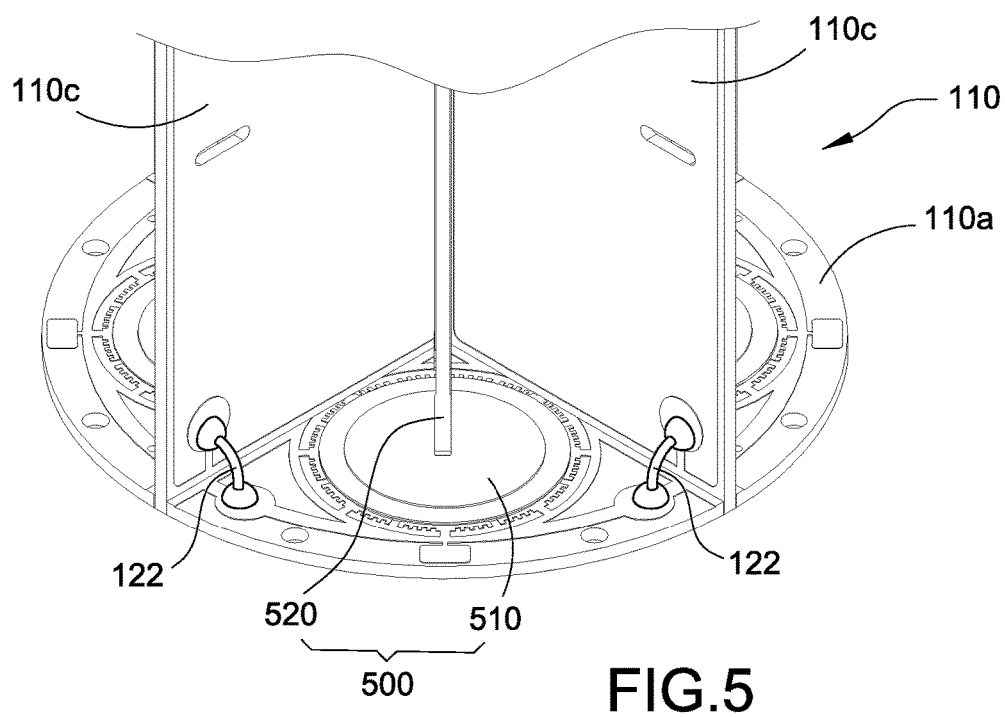
FIG. 5 is a further perspective schematic view of a preferred embodiment of a first platform of a detection apparatus of the present invention.

The first platform 100 comprises a plurality of first circuit board 110, and the circuit boards are joggled jointed and combined with each other, wherein at least one part of the first circuit boards 110 are electrically connected with each other by, but not limited to, soldering. For instance, as shown in FIG. 4, the first circuit board 110 can also be electrically connected by sticking conductive tape 121. Besides, as shown in FIG. 5, the first circuit board 110 can be electrically connected by wires 122. In the present embodiment, the first circuit boards 110 comprise bottom boards 110a disposed at interval and parallel to each other and a top board 110b. The bottom boards 110a and top board 110b are disposed horizontally. The first circuit boards 110 also comprise a plurality of vertical boards 110c. The vertical boards 110c are perpendicular to the bottom boards 110a and the top board 110b, and each of the vertical boards 110c is joggled jointed and combined with the bottom boards 110a and the top board 110b individually. Preferably, the bottom boards 110a and the top board 110b are circle boards separately; the vertical boards 110c are a couple of rectangular boards, and the vertical boards 110c are arranged perpendicular and are joggled jointed and combined with each other. The top board 110b is provided with a hole-electrode 111b and a slot-electrode 112b electrically connected with the top board 110b. The top board 110b is provided with a sheet-electrode 113b electrically connected with the top board 110b.

In the present embodiment, the second platform 200 preferably includes a second circuit board 210. The second circuit board 210 is provided with a plurality of nuts 221, 222, 223, and the nuts 221, 222, 223 are electrically connected with the second circuit board 210 separately. In the present embodiment, the nuts 221, 222, 223 are provided preferably three.

In the present embodiment, the quantity of the screw 310, 320, 330 is preferably corresponded with the quantity of the nuts 221, 222, 223, and each screw 310, 320, 330 is corresponded to the nut 221, 222, 223. Each of the screws 310, 320, 330 is screwed with the nut 221, 222, 223 correspondingly and abutted against the first platform 100. Thus the screws 310, 320, 330 are connected between the first platform 100 and the second platform 200 for supporting the second platform 200 on the top board 110b of the first platform 100. Preferably, the screws 310, 320, 330 are abutted against the hole-electrode 111b, the slot-electrode 112b, and a sheet-electrode 113b separately for electrically connected between the first platform 100 and the second platform 200. When the screws 310, 320, 330 are twisted, the screw 310 abutted against the hole-electrode 111b is fixed; the screw 320 abutted against the slot-electrode 112b has a degree of freedom in a line along the slot-electrode 112b; the screw 330 abutted against the sheet-electrode 113b has a degree of freedom in a plane along the sheet-electrode 113b. Thereby, the level of the second platform 200 can be adjusted through twisting the screws 310, 320, 330.

The carrying table 400 is supported on the top board 110b of the first platform 100 for holding the object 10.

In the present embodiment, the actuator mechanism 500 is disposed on the first platform 100. The actuator mechanism 500 includes a plurality of piezoelectric buzzers 510 disposed on the first platform 100, and the actuator mechanism 500 connects and moves together with the carrying table 400. The piezoelectric buzzers 510 are disposed on a face of the bottom board 110a and arranged toward the top board 110b, and the piezoelectric buzzers 510 are electrically connected with the bottom board 110a separately. The actuator mechanism 500 further includes a plurality of supporting poles 520 corresponding to the piezoelectric buzzers 510.

The supporting poles 520 are movably disposed through the top board 110b separately. One end of each supporting pole 520 is abutted against the piezoelectric buzzers 510 correspondingly, and the carrying table 400 is supported on the other end of the supporting poles 520. Therefore, the inclination of the carrying table 400 can be adjusted by electrifying each of the buzzers for pushing the supporting poles 520.

The detection module 600 used for testing the object 10 is disposed on the second platform 200. The detection module 600 is preferably disposed on the second circuit board 210 and electrically connected with the second circuit board 210. The detection module 600 includes a probe 610 and an optical sensing element 620. The probe 610 is disposed toward the carrying table 400 for contacting a surface of an object 10. The optical sensing element 620 is used for detecting a motion of the probe 610, and the optical sensing element 620 is preferably electrically connected with the second circuit board 210, wherein the optical sensing element 620 is provided as an optical lever or an optical pickup-head.

The relative position of the carrying table 400 and the probe 610 can be adjusted through, but bot limited to, adjusting the inclination of the carrying table 400. For example, the actuator mechanism 500 can be disposed on the second platform 200 and moved together with the detection module 600. The piezoelectric buzzers 510 of the actuator mechanism 500 can be disposed on the second circuit board 210 and connected between the piezoelectric buzzers 510 and the detection module 600 correspondingly through the supporting poles 520. Therefore, the relative position of the carrying table 400 and the probe 610 can be adjusted through adjusting the inclination of the detection module 600.

Each of the screws 310, 320, 330 is abutted against the hole-electrode 111b, the slot-electrode 112b, and a sheet-electrode 113b of the top board 110b of the first platform 100 respectively for electrically connecting the first platform 100 with the second platform 200, and thus the detection module 600 of the second platform 200 can electrically connect with the circuit board 110 of the first platform 100. Therefore circuits can be disposed on each circuit board 110 of the first platform 100 for operating the detection module 600.

In summary, the circuit boards of the detection apparatus of the present invention are joggled jointed and combined with each other. As the production of circuit boards is easy and has a low cost, and the joggled jointed is easily to be provided so that the price of the detection apparatus can be significantly lowered and will be benefit for facilitating mass production. Moreover, the detection apparatus of the present invention is configured by circuit boards, and thus the weight is much lighter than existing atomic force microscope for carry.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A detection apparatus used for detecting an object, including:
   a first platform comprising a plurality of first circuit boards being joggle jointed and combined with each other, at least part of the first circuit boards electrically connected to each other, a carrying table for carrying the object to be detected being disposed on the first platform;
   a second platform comprising at least one second circuit board, a detection module being disposed on the second platform for detecting the object, and the detection module electrically connected to at least a part of the at least one second circuit board; and a plurality of screws connected between the first platform and the second platform.

2. The detection apparatus according to claim 1, wherein the at least one second circuit board is provided with a plurality of nuts corresponding to the screws; each of the nuts is electrically connected with the at least one second circuit board, and each of the screws is screwed with the corresponding nut and abutted against the first platform.

3. The detection apparatus according to claim 2, wherein one of the first circuit boards is provided with a hole-electrode, a slot-electrode and a sheet-electrode, wherein one of the screws is abutted against the hole-electrode, another one of the screws is abutted against the slot-electrode, and still another one of the screws is abutted against the sheet-electrode.

4. The detection apparatus according to claim 3, wherein the screws are electrically connected with the hole-electrode, the slot-electrode and the sheet-electrode respectively for electrically connecting the first platform to the second platform.

5. The detection apparatus according to claim 1, further including an actuator mechanism disposed on the first platform.

6. The detection apparatus according to claim 5, wherein the actuator mechanism is connected and moved together with the carrying table.

7. The detection apparatus according to claim 5, wherein the actuator mechanism includes a plurality of piezoelectric buzzers disposed on the first platform and a plurality of supporting poles connected between the corresponding piezoelectric buzzers and the actuator mechanism.

8. The detection apparatus according to claim 1, further including an actuator mechanism disposed on the second platform.

9. The detection apparatus according to claim 8, wherein the actuator mechanism is connected and moved together with the detection module.

10. The detection apparatus according to claim 9, wherein the actuator mechanism includes a plurality of piezoelectric buzzers disposed on the second platform and a plurality of supporting poles connected between the corresponding piezoelectric buzzers and the actuator mechanism.

11. The detection apparatus according to claim 1, wherein each of the screws is electrically connected with one of the first circuit boards and one of the at least one second circuit board.

12. The detection apparatus according to claim 1, wherein the detection module-includes a probe.

13. The detection apparatus according to claim 1, wherein the detection module-includes an optical sensing element.

* * * * *